(12) United States Patent
Wu et al.

(10) Patent No.: US 8,259,443 B2
(45) Date of Patent: Sep. 4, 2012

(54) TILTING PORTABLE ELECTRONIC DEVICE

(75) Inventors: Kun-Tsan Wu, Shindian (TW);
Wei-Shan Hu, Shindian (TW);
Chuan-Bao Hong, Shenzhen (CN)

(73) Assignees: Shenzhen Futaihong Precision Industry Co., Ltd., ShenZhen, Guangdong Province (CN); FIH (Hong Kong) Limited, Kowloon (HK)

( * ) Notice: Subject to any disclaimer, the term of this patent is extended or adjusted under 35 U.S.C. 154(b) by 221 days.

(21) Appl. No.: 12/854,265

(22) Filed: Aug. 11, 2010

(65) Prior Publication Data

US 2011/0216484 A1    Sep. 8, 2011

(30) Foreign Application Priority Data

Mar. 5, 2010    (CN) .......................... 2010 1 0118624

(51) Int. Cl.
*H05K 5/02*    (2006.01)
*H04M 1/02*    (2006.01)

(52) U.S. Cl. .............. 361/679.56; 361/679.01; 312/309; 455/575.1; 16/239

(58) Field of Classification Search ............ 361/679.01, 361/679.55–679.56; 16/239, 357, 360–361; 312/309; 455/575.1, 575.4
See application file for complete search history.

(56) References Cited

U.S. PATENT DOCUMENTS

| | | | | |
|---|---|---|---|---|
| 2011/0156555 A1* | 6/2011 | Wu et al. | ....................... | 312/309 |
| 2011/0156556 A1* | 6/2011 | Wu et al. | ....................... | 312/309 |
| 2011/0156557 A1* | 6/2011 | Wu et al. | ....................... | 312/309 |
| 2011/0156558 A1* | 6/2011 | Wu et al. | ....................... | 312/309 |
| 2011/0156559 A1* | 6/2011 | Wu et al. | ....................... | 312/309 |
| 2011/0157784 A1* | 6/2011 | Wu et al. | ................. | 361/679.01 |
| 2011/0157786 A1* | 6/2011 | Wu et al. | ................. | 361/679.01 |
| 2011/0170245 A1* | 7/2011 | Wu et al. | ................. | 361/679.01 |
| 2011/0175507 A1* | 7/2011 | Wu et al. | ....................... | 312/309 |
| 2011/0176262 A1* | 7/2011 | Wu et al. | ................. | 361/679.01 |
| 2011/0188182 A1* | 8/2011 | Wu et al. | ................. | 361/679.01 |
| 2011/0188183 A1* | 8/2011 | Wu et al. | ................. | 361/679.01 |
| 2011/0228452 A1* | 9/2011 | Wu et al. | ................. | 361/679.01 |

* cited by examiner

*Primary Examiner* — Robert J Hoffberg
(74) *Attorney, Agent, or Firm* — Altis Law Group, Inc.

(57) ABSTRACT

A tilting mechanism includes a fixing plate, a sliding plate, a swing member rotatably connecting to the fixing plate and the sliding plate; The tilting mechanism includes a first connecting plate rotatably connecting to the fixing plate, a second connecting plate rotatably connecting to the sliding plate, and a hinge having a pivoting portion and a fixing portion rotatably connecting to the pivoting portion, the pivoting portion is secured with the second connecting member and the fixing portion is secured with the first connecting member. The disclosure includes a portable electronic device using the tilting mechanism.

10 Claims, 5 Drawing Sheets

TILTING PORTABLE ELECTRONIC DEVICE

BACKGROUND

1. Field of the Invention

The present invention relates to tilting portable electronic devices.

2. Description of Related Art

Conventional portable electronic device can be classified as bar-type devices, rotating-type devices and sliding-type devices. The bar-type device has a housing secured with a cover. The rotating-type device includes a housing and a cover rotatably attached to the housing about a single axis. The sliding-type device has a housing and a cover slidably attached to the housing.

However, sliding-type electronic devices have the following problems. When a user wants to watch a display of the electronic device resting on a table, it is desirable to have an additional support for supporting the electronic device in a slanted position to give the display a better viewing angle. Alternatively, the user may grip and tilt the electronic device with his hands, however, it may become uncomfortable after a long period of time.

Therefore, there is room for improvement within the art.

BRIEF DESCRIPTION OF THE DRAWINGS

Many aspects of the present tilting portable electronic device can be better understood with reference to the following drawings. The components in the various drawings are not necessarily drawn to scale, the emphasis instead being placed upon clearly illustrating the principles of the present tilting portable electronic device. Moreover, in the drawings, like reference numerals designate corresponding parts throughout the diagrams.

DETAILED DESCRIPTION

Figure 1:
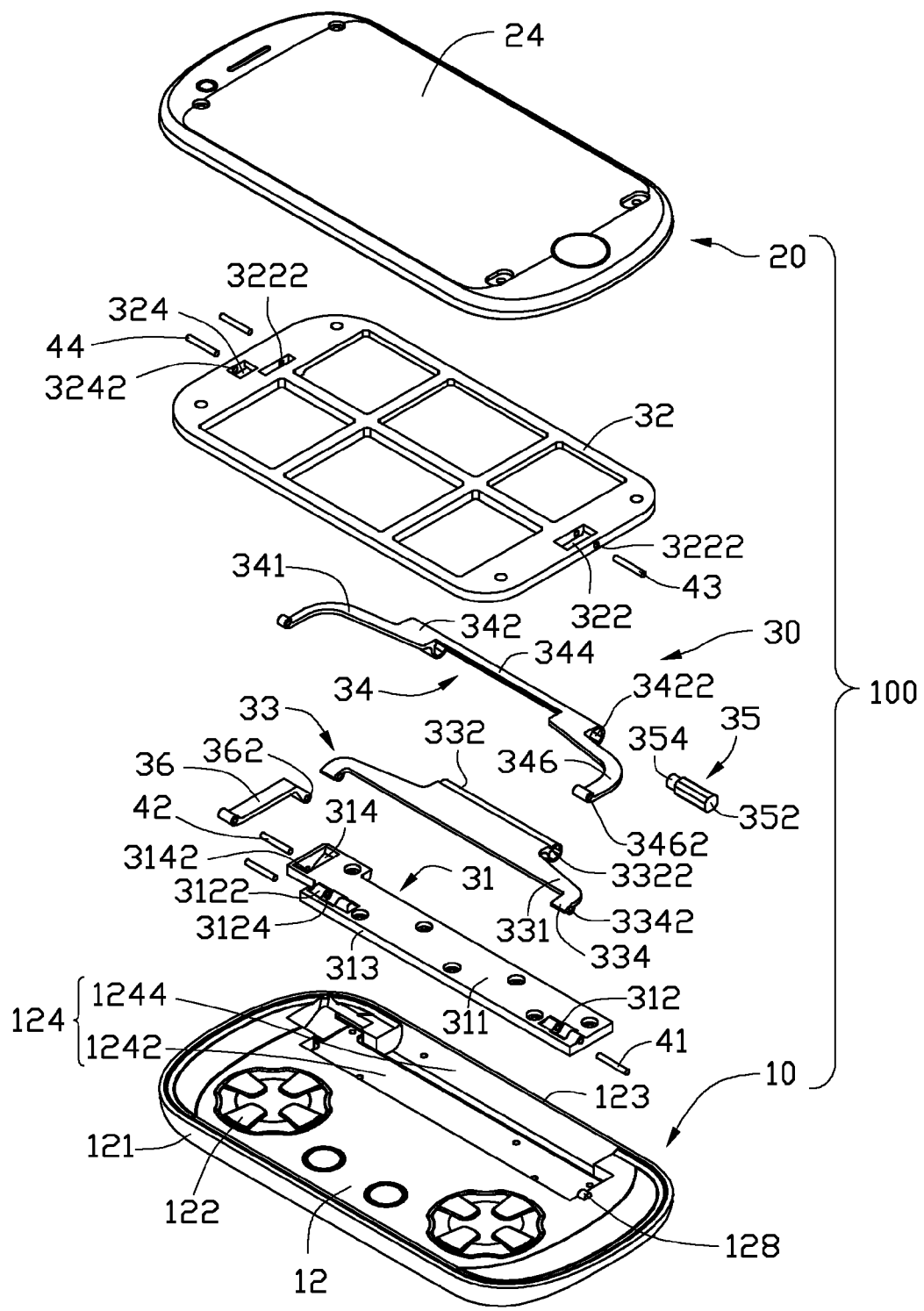
FIG. 1 is an exploded view of a tilting portable electronic device according to an exemplary embodiment.

FIG. 1 shows a tilting portable electronic device 100, such as a mobile phone, personal digital assistant (PDA), digital camera, including a housing 10, a cover 20, and a tilting mechanism 30. The tilting mechanism 30 is assembled between the housing 10 and the cover 20. The cover 20 can be opened and tilted relative to the housing 10.

The housing 10 has an upper surface 12, a first end surface 121 and a second end surface 123 parallel with the first end surface 121. The upper surface 12 has two keypads 122 positioned thereon. The keypads 122 are adjacent to the first end surface 121. The upper surface 12 defines an assembling recess 124 parallel along the second end surface 123. The assembling recess 124 is stepped and includes a first assembling section 1242 and a second assembling section 1244. The second assembling section 1244 is deeper than the first assembling section 1242 and abuts to the second end surface 123. A stopper 128 for stopping the cover 20 from further sliding is formed on the upper surface 12 and located at a side of the first assembling section 1242.

Figure 2:
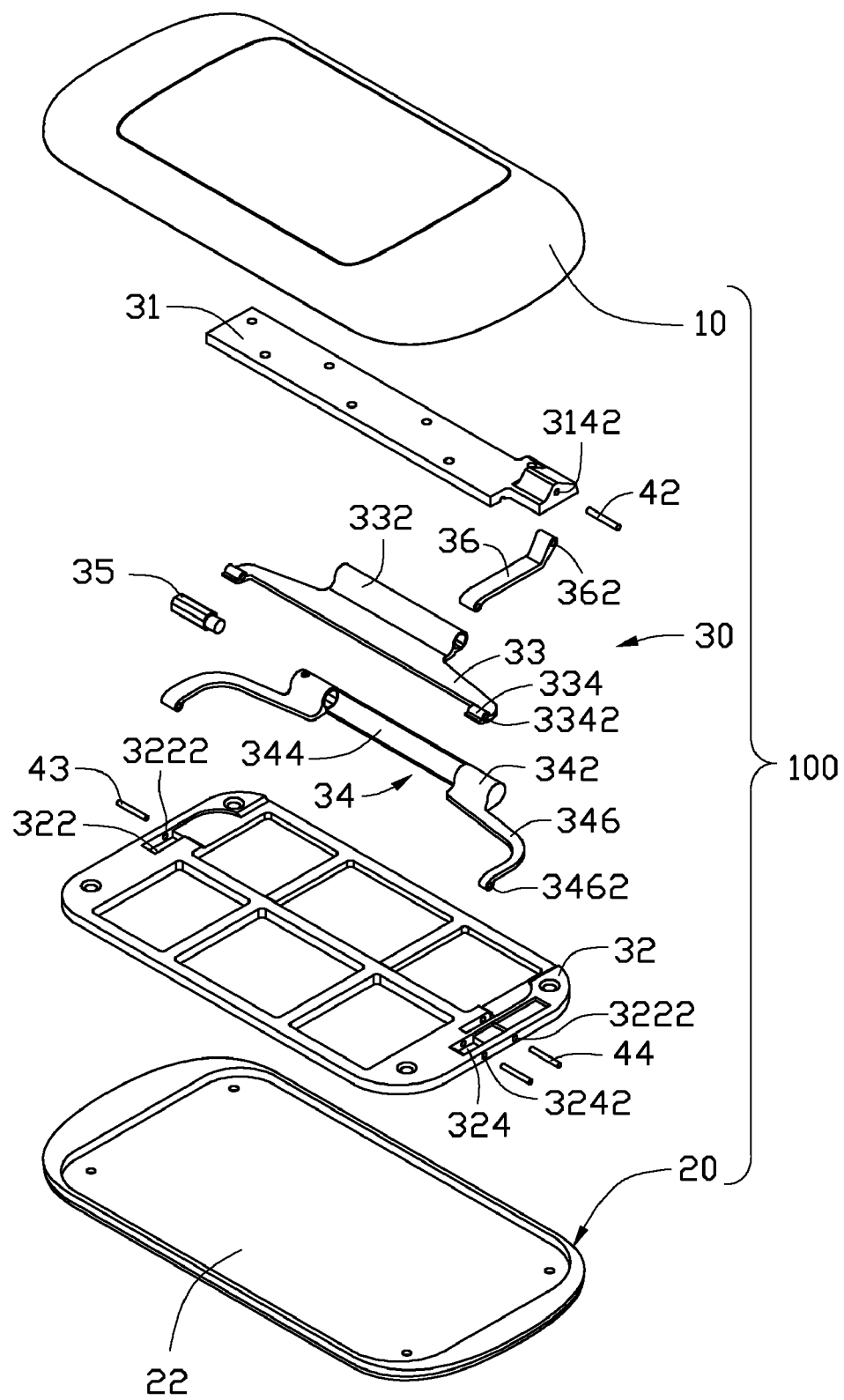
FIG. 2 is an exploded view of the tilting portable electronic device shown in FIG. 1, viewing form another angle.

Further to FIG. 2, the cover 20 has an accommodating chamber 22 defined in the bottom surface, and the accommodating chamber 22 can partially receive the tilting mechanism 30 therein. The cover 20 forms a display 24 on the opposite top surface.

The titling mechanism 30 includes a fixing plate 31, a sliding plate 32, a first connecting member 33, a second connecting member 34, a hinge 35 and a swing member 36. The fixing plate 31 can engage into the first assembling section 1242. The fixing plate 31 has a main wall 311 and an end wall 313. The main wall 311 has two latching grooves 312 adjacent to the end wall 313 for rotatably connecting the first connecting member 33 to the fixing plate 31. Two parallel and spacing protrusions 3122 protrude from the main wall 311 and cooperatively define each one of the latching grooves 312. A first latching hole 3124 passes through the two protrusions 3122, perpendicular to the latching groove 312 for latching a first pin 41 therein. The fixing plate 31 defines a connecting groove 314 in the main wall 311 and adjacent to a side wall. The connecting groove 314 laterally defines a second latching hole 3142 for rotatably connecting the swing member 36 to the fixing plate 31. The second latching hole 3142 can receive a second pin 42 therein.

The sliding plate 32 can be assembled in the accommodating chamber 22. The sliding plate 32 defines two opposite first engaging holes 322 and a second engaging hole 324. Each first engaging hole 322 is adjacent to a side of the sliding plate 32 for rotatably connecting the sliding plate 32 to the second connecting member 34. A first hinge hole 3222 passes through the two opposite sidewalls of the first engaging hole 322 and can assemble with a third pin 43. The second engaging hole 324 is near one of the first engaging holes 322 for rotatably connecting the sliding plate 32 to the swing member 36. A second hinge hole 3242 passes through the two opposite sidewalls of the second engaging hole 324 and can assemble a fourth pin 44 therein.

The first connecting member 33 includes a first plate portion 331, a first bush portion 332, and two first connecting arms 334. The first bush portion 332 is positioned at a side of the first plate portion 331 and used to engage with the second connecting member 34. The first bush portion 332 has a first axis hole 3322 to receive an end of the hinge 35. Each first connecting arm 334 is located at each end of the first plate portion 331, laterally extending relative to the first bush portion 332. The first connecting arm 334 defines a first passage 3342 and can be placed into the latching groove 312 with the first passage 3342 aligning with the latching hole 3124. Accordingly, the first pin 41 can pass through the latching hole 3124 and the first passage 3342 to rotatably connect the first connecting member 33 to the fixing plate 31.

The second connecting member 34 generally has the similar shape with the first connecting member 33. The second connecting member 34 includes a second plate portion 341, a second bush portion 342 and two second connecting arms 346. The second bush portion 342 is located at a side of the second plate portion 341 and has axially a second axis hole 3422 to receive the other end of the hinge 35. The second plate portion 341 defines a cutout 344 interconnecting with the second axis hole 3422 of the second bush portion 342, the cutout 344 can receive the first bush portion 332 of the first connecting member 33 therein, with the first axis hole 3322 aligning with the second axis hole 3422. The two second connecting arms 346 are respectively located at each end of the second plate portion 341, and laterally extending relative to the second bush portion 342. The second connecting arm 346 defines a second passage 3462 and can be placed into the first engaging hole 322, with the second passage 3462 aligning with the first hinge hole 3222. Accordingly, the third pin 43 can pass through the first hinge hole 3222 and the second passage 3462 for rotatably connecting the second connecting member 34 to the sliding plate 32.

The hinge 35 is a partially automatic namely can be manually operated yet automatically work after a predetermined operation angle. The hinge 35 includes a fixing portion 352 and a pivoting portion 354 at an end of the fixing portion 352. The pivoting portion 354 can axially rotate relative to the fixing portion 352. The fixing portion 352 can be engagably inserted into the second axis hole 3422. The pivoting portion 354 can be engagably inserted into the first axis hole 3322. The hinge 35 can have an elastic member (not shown) between the fixing portion 352 and the pivoting portion 354.

The swing member 36 is generally a strip bar and defines a connecting hole 362 at two ends. One end of the swing member 36 can extend into the connecting groove 314 of the fixing plate 31, with one of the connecting holes 362 aligning with the second latching hole 3142. The second pin 42 can pass through the second latching hole 3142 and the one of the connecting holes 362 to rotatably connect the swing member 36 to the fixing plate 31. The other end of the swing member 36 can extend into the second engaging hole 324 of the sliding plate 32, with another of connecting holes 362 aligning with the second hinge hole 3242. The fourth pin 44 can pass through the second hinge hole 3242 and the another of the connecting holes 362 to rotatably connect the swing member 36 to the sliding plate 32.

Figure 3:
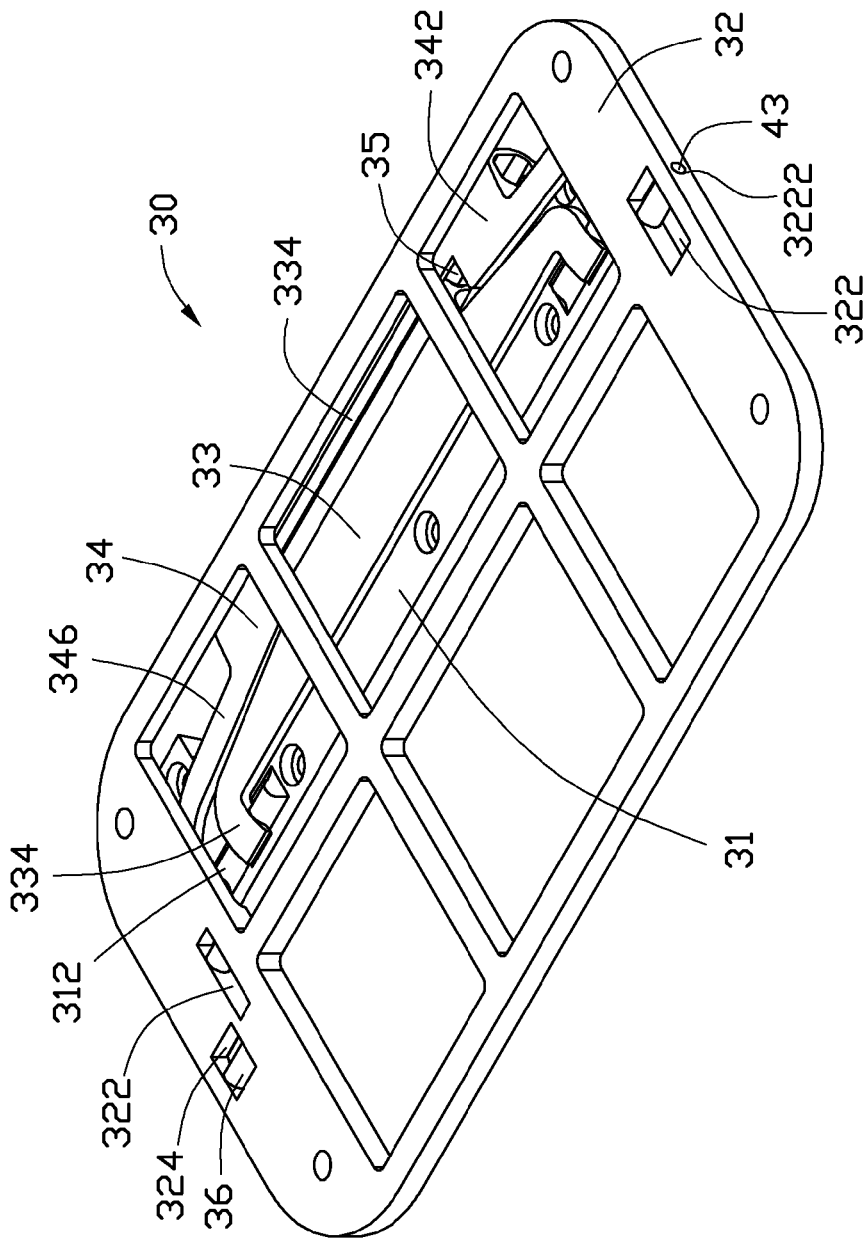
FIG. 3 is an assembled schematic view of a tilting mechanism in the closed position.

Referring to FIG. 3, to assemble the electronic device 100, the first connecting member 33 connects with the second connecting member 34, with the first bush portion 332 being received in the cutout 344. The fixing portion 352 and the pivoting portion 354 are placed into the second axis hole 3422 and the first axis hole 3322. The first connecting member 33 rotatably connects to the fixing plate 31. Each first pin 41 passes through the latching hole 3124 and the first passage 3342. The second connecting member 34 rotatably connects to the sliding plate 32. Each third pin 43 passes through the first hinge hole 3222 and the second passage 3462. The swing member 36 rotatably connects to the fixing plate 31 and the sliding plate 32. The second pin 42 passes through the second latching hole 3142 and one of the connecting holes 362, and the fourth pin 44 passes through the second hinge hole 3242 and the other connecting hole 362. The titling mechanism 30 is assembled.

Figure 4:
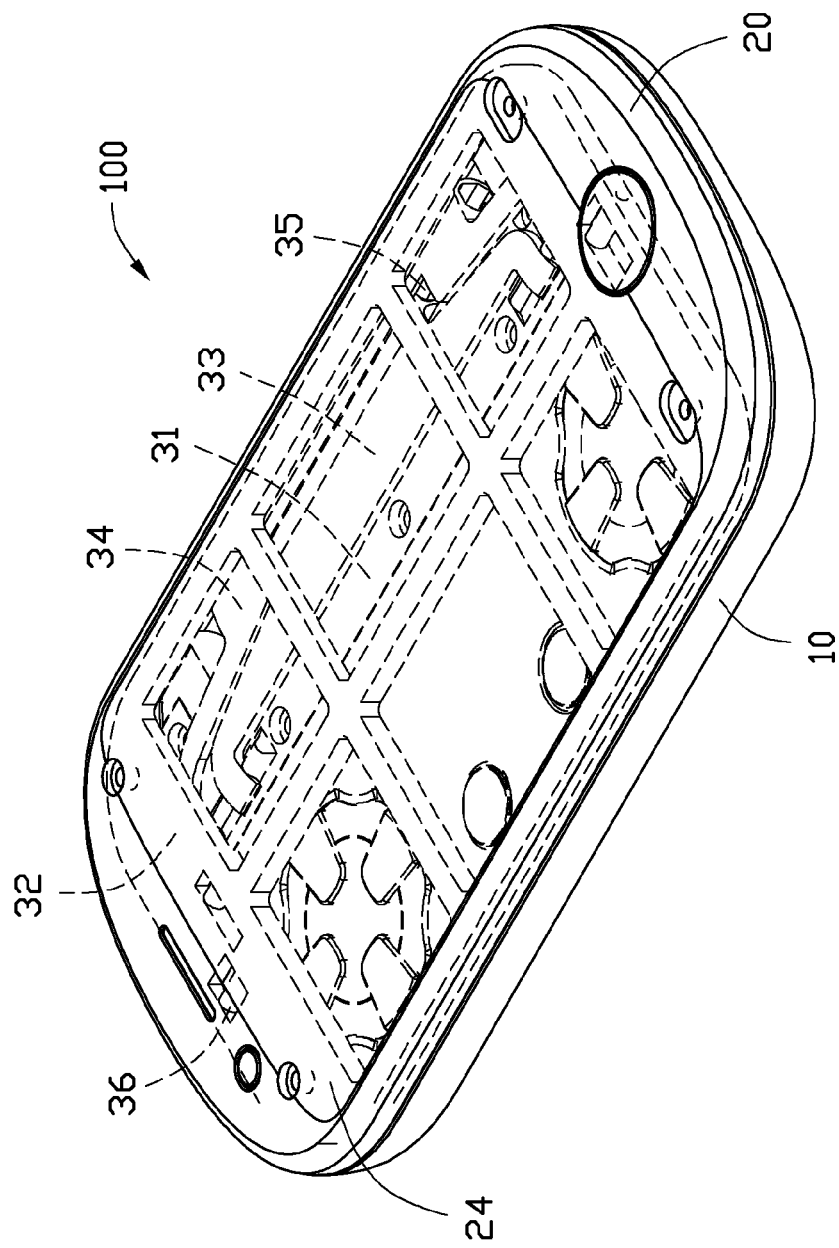
FIG. 4 is an assembled, perspective schematic view of the electronic device shown in FIG. 1 with the cover closed relative to the housing.

Referring to FIG. 4, the titling mechanism 30 connects with the housing 10 and the cover 20. The fixing plate 31 is fixed into the first assembling section 1242 of the assembling recess 124. Correspondingly, the first connecting member 33 and the second connecting member 34 extend to the second assembling section 1244. Then, the sliding plate 32 is secured with the cover 20, with the sliding plate 32 being received in the accommodating chamber 22. Thus, the electronic device 100 is completely assembled.

Figure 5:
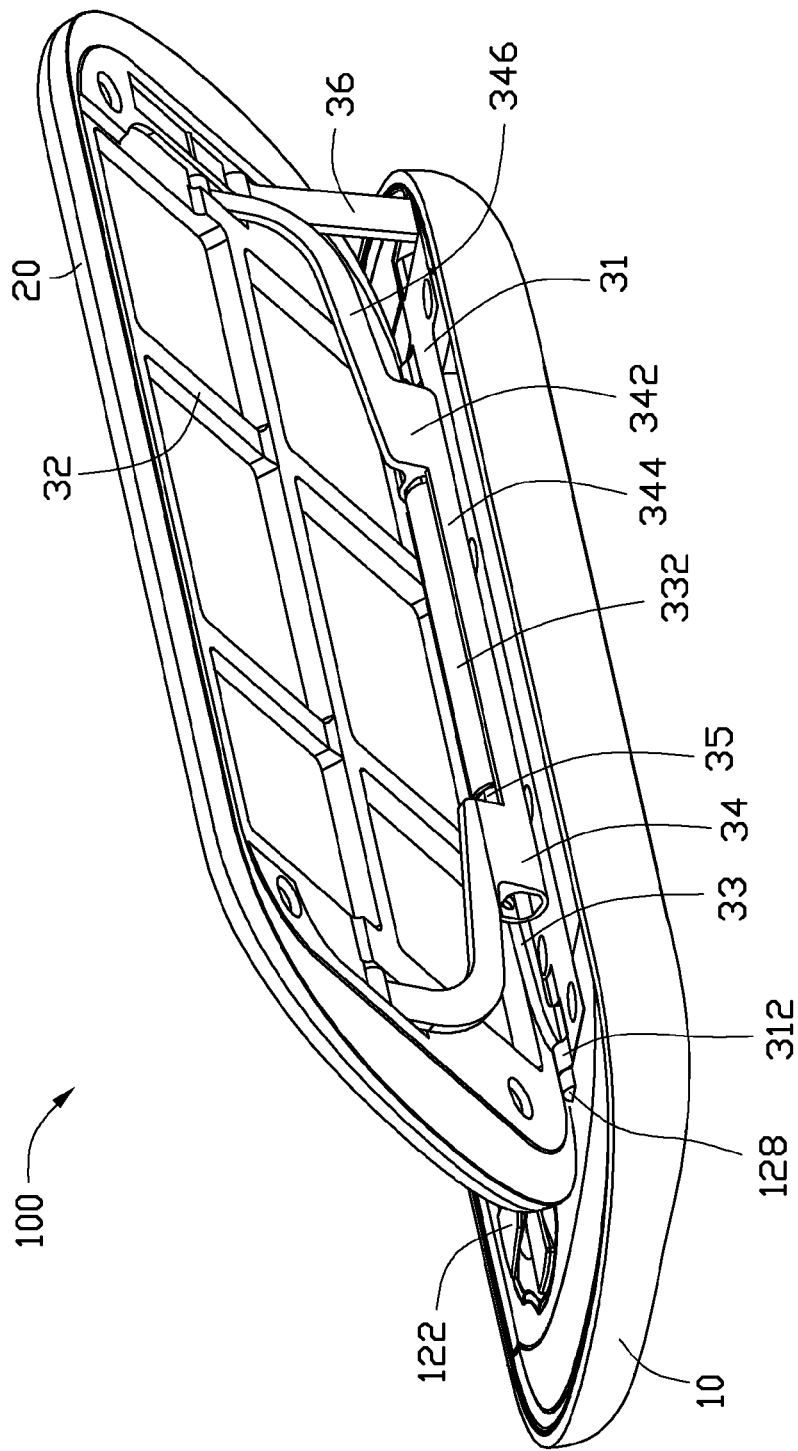
FIG. 5 is a schematic view of the electronic device shown in FIG. 1 with the cover opened in a tilted position relative to the housing.

Referring to FIG. 5, to open the cover 20 needs to push the end of the cover 20 which is adjacent to the first end surface 121 of the housing 10. The other opposite end of the cover 20 slides correspondingly. The swing member 36 rotates about the second pin 44, causing the first connecting member 31 to rotate relative to the housing 10, and the second connecting member 33 to rotate relative to the first connecting member 31 by the hinge 35. Due to the partially automatic hinge 35, after the pivoting portion 354 rotates over a predetermined angle relative to the fixing portion 352, the hinge 35 automatically works to drive the pivoting portion 354 to automatically rotate completely. An end of the cover 20 slides along the upper surface 12, and the other end of the cover 20 rotates to open, the cover 20 in a slanted state relative to the housing 10 after being opened. At the moment, the end of the cover 20 resists against the stoppers 128. To close the cover 20, it is needed to press downward the end of the cover 20.

It is to be understood that even though numerous characteristics and advantages of the present embodiments have been set forth in the foregoing description, together with details of structures and functions of various embodiments, the disclosure is illustrative only, and changes may be made in detail, especially in matters of shape, size, and arrangement of parts within the principles of the present invention to the full extent indicated by the broad general meaning of the terms in which the appended claims are expressed.

What is claimed is:

1. A tilting mechanism, comprising:
a fixing plate;
a sliding plate;
a swing member rotatably connecting to the fixing plate and the sliding plate;
a first connecting member rotatably connecting to the fixing plate, the first connecting member includes a first bush portion, the first bush portion defines a first axis hole;
a second connecting member rotatably connecting to the sliding plate, the second connecting member includes a second bush portion, the second bush portion defines a second axis hole; and
a hinge with two ends respectively secured with the second connecting member and the first connecting member, the hinge includes a pivoting portion and a fixing portion rotatably connecting to the pivoting portion, the fixing portion and the pivoting portion are respectively secured into the first axis hole and the second axis hole, the hinge making the second connecting member rotatable relative to the first connecting member.

2. The tilting mechanism as claimed in claim 1, wherein the first connecting member includes a first plate portion and two first connecting arms, the first bush portion is formed at a side of the first plate portion, the two first connecting arms are formed at the opposite side of the first plate portion, with each of the first connecting arms rotatably connects to the fixing plate.

3. The tilting mechanism as claimed in claim 2, wherein the fixing plate has a main wall forming two latching grooves thereon, each latching groove of the two latching grooves is defined by two parallel and spaced protrusions protruding on the main wall, the each latching groove engages with a respective one of the first connecting arms.

4. The tilting mechanism as claimed in claim 1, wherein the second connecting member includes a second plate portion, the second bush portion is formed at a side of the second plate portion, the second plate portion defines a cutout interconnecting with the second axis hole, the cutout receives the first bush portion therein, with the first axis hole aligning with the second axis hole.

5. The tilting mechanism as claimed in claim 4, wherein the second connecting member includes two second connecting arms extending at another side of the second plate portion, opposite to the second bush portion, the two second connecting arms rotatably connect to the sliding plate.

6. A tilting portable electronic device, comprising:
a housing;
a cover;
a tilting mechanism rotatably connecting to the housing and the cover, the tilting mechanism includes:

a fixing plate secured with the housing;
a sliding plate secured with the cover;
a swing member rotatably connected to the fixing plate and the sliding plate;
a first connecting member rotatably connecting to the fixing plate,
a second connecting member rotatably connecting to the sliding plate, and
a hinge with two ends thereof respectively secured with the first connecting member and the second connecting member, wherein the hinge has a pivoting portion and a fixing portion rotatably connects to the pivoting portion, the pivoting portion is secured with the second connecting member and the fixing portion is secured with the first connecting member.

7. The tilting portable electronic device as claimed in claim 6, wherein the housing defines an assembling recess for receiving the fixing plate, the assembling recess includes a first assembling section and a second assembling section deeper than the first assembling section.

8. The tilting portable electronic device as claimed in claim 6, wherein the fixing plate forms two stoppers to prevent the cover from sliding after the cover is opened.

9. The tilting portable electronic device as claimed in claim 6, wherein the cover defines an accommodating chamber to receive the sliding plate.

10. The tilting portable electronic device as claimed in claim 6, wherein the swing member is a strip bar.

* * * * *